United States Patent
Lin et al.

(10) Patent No.: US 9,589,606 B2
(45) Date of Patent: Mar. 7, 2017

(54) HANDLING MAXIMUM ACTIVATION COUNT LIMIT AND TARGET ROW REFRESH IN DDR4 SDRAM

(71) Applicants: Jiang Lin, Austin, TX (US); Matthew Garrett, Austin, TX (US)

(72) Inventors: Jiang Lin, Austin, TX (US); Matthew Garrett, Austin, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 120 days.

(21) Appl. No.: 14/560,674

(22) Filed: Dec. 4, 2014

(65) Prior Publication Data

US 2015/0200002 A1    Jul. 16, 2015

Related U.S. Application Data

(60) Provisional application No. 61/927,636, filed on Jan. 15, 2014.

(51) Int. Cl.
*G06F 12/02* (2006.01)
*G11C 7/10* (2006.01)
*G11C 11/406* (2006.01)
*G06F 12/10* (2016.01)
*G06F 13/16* (2006.01)

(52) U.S. Cl.
CPC ........ *G11C 7/1072* (2013.01); *G06F 12/1009* (2013.01); *G06F 13/1636* (2013.01); *G11C 11/40611* (2013.01); *G11C 11/40618* (2013.01); *G11C 11/40603* (2013.01)

(58) Field of Classification Search
None
See application file for complete search history.

(56) References Cited

U.S. PATENT DOCUMENTS 5,883,849 A * 3/1999 Shirley ............... G11C 11/4096
365/189.02

* cited by examiner

*Primary Examiner* — Duc Doan
(74) *Attorney, Agent, or Firm* — Sughrue Mion, PLLC (57) ABSTRACT

Efficiently tracking activations to rows of memory using a reduced number of row activation counters that indicate whether a memory row is activated during an activation period and row activation counters that indicate a number of permitted activations to a memory row within a maximum activation window.

20 Claims, 5 Drawing Sheets

| DRAM Timing Parameters | | |
|---|---|---|
| tMAW | 64000000 | ns |
| tMAC | 300000 | times |
| tRCRow | 213.3333 | ns |
| tREFI | 7800 | ns |
| tRFC | 350 | ns |
| tRRD_L | 5 | ns |
| tFAW | 13 | ns |
| tMOD | 15 | ns |
| tRAS | 32 | ns |
| tRP | 15 | ns |
| tRCD | 15 | ns |
| tRC | 47 | ns |

FIG. 1

| DRAM Timing Parameters | | |
|---|---|---|
| tMAW | 64000000 | ns |
| tMAC | 300000 | times |
| tRCRow | 213.3333 | ns |
| tREFI | 7800 | ns |
| tRFC | 350 | ns |
| tRRD_L | 5 | ns |
| tFAW | 13 | ns |
| tMOD | 15 | ns |
| tRAS | 32 | ns |
| tRP | 15 | ns |
| tRCD | 15 | ns |
| tRC | 47 | ns |

| DDR4 Device Parameters | |
|---|---|
| Device Density | 8GBx4 |
| #Devices/Rank | 16 |
| x64 channel capacity | 16GB |
| #Banks/Rank | 16 |
| #Rows/Bank | 128K |
| Page size/Rank | 8KB |
| Page size/device | 512B |
| Data rate | 2400MT/s |
| Bus Frequency | 1200MHz |

FIG. 6

| Schemes | | | Performance Degradation. (Smaller is better) Number of Rows/Bank: 128K Address pattern: round robin, reaches N rows, 64B read/activate | | | | | | | |
|---|---|---|---|---|---|---|---|---|---|---|
| | | | Enter TRR Mode | | | | Throttle Activates | | | |
| Name | Width of counter (bit) | Per-bank storage (Kbits) | N>=6 | N=4 | N=2 | N=1 | N>=6 | N=4 | N=2 | N=1 |
| Scheme 1: Refresh more often | 0 | 0 | 16.6% | 16.6% | 16.6% | 16.6% | NA | | | |
| Scheme 2: A leaking bucket counter per row | 19 | 2432 | 0.0% | 0.0% | 0.0% | 0.0% | 0.0% | 11.7% | 55.9% | 77.9% |
| | 16 | 2048 | 0.0% | 1.4% | 1.4% | 1.4% | 0.0% | 11.7% | 55.9% | 77.9% |
| | 8 | 1024 | 0.0% | 5.3% | 5.4% | 5.5% | 0.0% | 11.7% | 55.9% | 77.9% |
| | 4 | 512 | 0.0% | 16.9% | 18.6% | 19.6% | 0.0% | 11.7% | 55.9% | 77.9% |
| Scheme 3: 16 one bit counters and 8 leaking bucket counters per bank | 19 | 0.168 | 0.0% | 0.0% | 0.0% | 0.0% | 0.0% | 11.7% | 55.9% | 77.9% |
| | 16 | 0.144 | 0.0% | 1.4% | 1.4% | 1.4% | 0.0% | 11.7% | 55.9% | 77.9% |
| | 8 | 0.080 | 0.0% | 5.3% | 5.4% | 5.5% | 0.0% | 11.7% | 55.9% | 77.9% |
| | 4 | 0.048 | 0.0% | 16.9% | 18.6% | 19.6% | 0.0% | 11.7% | 55.9% | 77.9% |

HANDLING MAXIMUM ACTIVATION COUNT LIMIT AND TARGET ROW REFRESH IN DDR4 SDRAM

CROSS-REFERENCE TO RELATED PATENT APPLICATION

This application claims the benefit of U.S. Provisional Application No. 61/927,636, filed on Jan. 15, 2014, in the United States Patent and Trademark Office, the disclosure of which is incorporated herein by reference in its entirety.

BACKGROUND

Methods and apparatuses consistent with exemplary embodiments relate to tracking activations to rows of memory, and more particularly to a method and apparatus for efficiently tracking activations to rows of memory using a reduced number of row activation counters.

When a target row of a dynamic random access memory (DRAM) is activated too many times within a time period, the data stored at adjacent rows, which are physically adjacent to the target row, may be disturbed or lost. In particular, due to increasing density of DRAM design, the data stored at an adjacent row may be corrupted due to noise generated from the frequent activation of the target row.

Accordingly, for some DRAM devices, a manufacturer may determine a maximum number of activations to a target row within a time period based on, for example, the architecture of the DRAM and a rate at which activations of a target row may corrupt data stored in adjacent rows of the DRAM. Once the number of activations in the time period is reached, adjacent rows should be refreshed to avoid corruption of the data stored in the adjacent rows.

The maximum number of activations to a target row within a time period may be conventionally referred to as the maximum activation count (MAC). The MAC is the maximum number of activations to a target row within a time period, namely the maximum activation window (tMAW), before the adjacent rows should be refreshed to avoid data corruption.

A situation associated with the corruption of data stored in an adjacent row due to frequent activations of a target row may occur when one or two "aggressor" rows target one "victim" row. For example, multiple target aggressor rows, between which the adjacent victim row is disposed, may be frequently activated. Therefore, the sum of the activations from the two aggressor rows for a given victim row should not exceed the MAC, as the activations to both the aggressor rows may contribute to the corruption of the data stored at the adjacent victim row.

If the MAC limit is reached within the maximum activation window, prior to sending another activate to a target row, the memory controller may either refresh all rows in the DRAM, perform a Targeted Row Refresh (TRR), to refresh only the rows adjacent to the over-activated target row, or throttle the activations to the target row such that the MAC limit will never be reached, which avoids having to perform the complete refresh of all rows or the TRR, but which delays fulfillment of the row activation.

In the above scenario, managing the MAC for the victim row is complicated by the fact that a memory controller, which controls activations to the rows in the DRAM, does not know the physical orientation of the rows. As such, the memory controller cannot track the activations to both of the aggressor rows with respect to a given victim row. To protect against exceeding the MAC for a victim row, an effective MAC value may be set to MAC/2 activations in the maximum activation window.

Managing the MAC limit conventionally requires tracking the number of activations that have been sent to each row of the DRAM within the maximum activation window. To truly track the number of activations to each row requires a counter for each row for each bank, and for each rank in the DRAM. In a DRAM with up to 4 ranks and 16 banks per rank, and 128K rows per bank, the number of counters would be 4×16×128K=8192K counters, with each counter requiring N bits. This quantity of counters and the associated space required for their management quickly become unmanageable from a power/area perspective of memory controller design.

SUMMARY

Exemplary embodiments may overcome the above disadvantages. However, an exemplary embodiment is not required to overcome the above disadvantages.

According to an aspect of an exemplary embodiment, there is provided a memory controller for controlling a memory, the memory controller including a page table configured to store: a first entry table including a first entry, the first entry comprising: a first identifier that identifies a first memory row of the memory activated during a first period of time; and a timeout counter that indicates a first remaining time during the first period of time, and a second entry table including a second entry, the second entry comprising: a second identifier that identifies a second memory row of the memory activated during at least one second period of time; an activation counter that counts a quantity of activations of the second memory row; and a second timeout counter that indicates a second time remaining during the at least one second period of time.

According to an aspect of an exemplary embodiment, there is provided a method of tracking activations to rows of a memory, the method including storing a page table in memory, the page table configured to store: a first entry table including a first entry, the first entry comprising: a first identifier that identifies a first memory row of the memory activated during a first period of time; and a timeout counter that indicates a first time remaining during the first period of time, and a second entry table including a second entry, the second entry comprising: a second identifier that identifies a second memory row of the memory activated during at least one second period of time; an activation counter that counts a quantity of activations of the second memory row; and a second timeout counter that indicates a second time remaining during the at least one second period of time; and tracking the activations to the rows of the memory using the page table.

BRIEF DESCRIPTION OF THE DRAWINGS

The above and/or other aspects will become more apparent by describing in detail exemplary embodiments with reference to the attached drawings in which.

DETAILED DESCRIPTION OF EXEMPLARY EMBODIMENTS

Exemplary embodiments will now be described more fully with reference to the accompanying drawings, in which like reference numerals refer to like elements throughout. Expressions such as "at least one of," when preceding a list of elements, modify the entire list of elements and do not modify the individual elements of the list.

Figure 1:
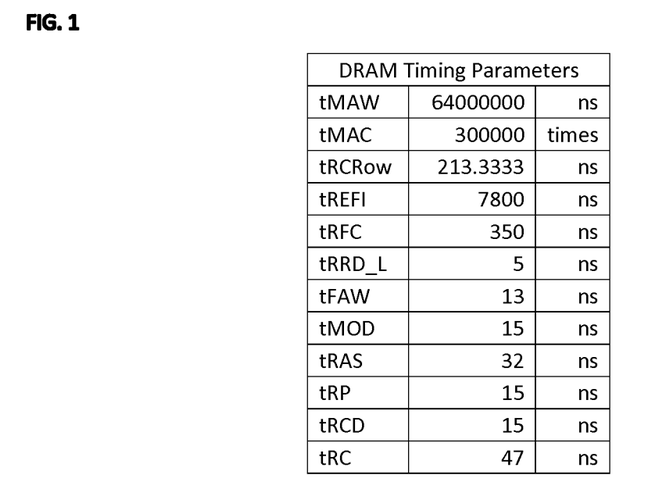
FIG. 1 illustrates timing parameters of a DRAM, according to an exemplary embodiment.

FIG. 1 illustrates timing parameters of a DRAM, according to an exemplary embodiment.

By understanding various DRAM timing parameters, which limit the number of activations that may be asserted to a target row in the DRAM in maximum activation window (tMAW), the number of rows of the DRAM that need to be simultaneously tracked to avoid violation of the MAC limit, or significantly impacting the performance of the overall DRAM system, may be reduced.

As illustrated in FIG. 1, timing parameters of a DRAM may include the DRAM maximum activation window (tMAW) and a maximum number of activations (MAC) to a row within the tMAW. Such parameters may be determined by a manufacturer of the DRAM, as discussed above.

To implement row activation tracking for MAC, a memory controller according to an exemplary embodiment includes an additional timing parameter tRCRow, which is an average amount of time between activations to a same target row, calculated as follows:

$$tRCRow = \frac{tMAW}{\left(\frac{MAC}{2}\right)}$$

As noted above, the value $$\left(\frac{MAC}{2}\right)$$

may be the effective MAC value.

The value of tRCRow may be initialized as shown above, and may be reset during execution according to a number of activations (ActCTR) to a row that has been activated during a tRCRow window, as shown below:

$$tRCRow = \frac{tMAW}{\left(\frac{MAC - ActCTR}{2}\right)}$$

The ActCTR value that is included in the tRCRow calculation is based on the maximum number of activates that can be counted by a page table structure storing entries indicating a number of activations for a particular row that has been activated during one or more tRCRow windows, as will be discussed below. This is determined by the width of the ActCTR implementation. Thus, the value of tRCRow may be reset based on the maximum value of the number of activations (ActCTR) to a row that has been activated during a tRCRow window.

Additional timing parameters may include a refresh interval (tREFI), a time required to complete a refresh command (tRFC), power limit delivery parameters (tRRD_L and tFAW), an update timing parameter (tMOD), read delay timing parameters (tRCD), and bank timing parameters (tRAS, tRP, and tRC). Again, such parameters may be determined by a manufacturer of the DRAM, based on architecture selection.

Figure 2:
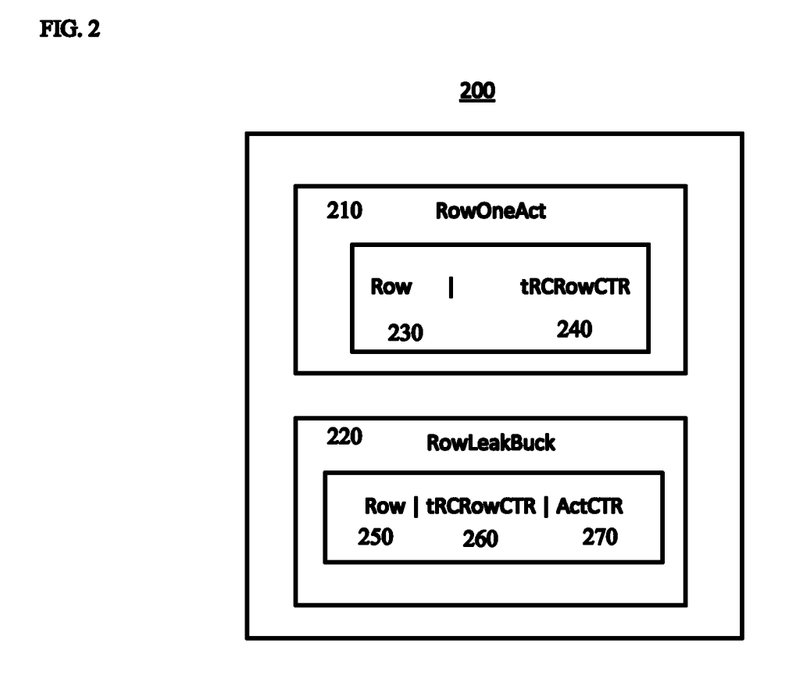
FIG. 2 illustrates a page table, according to an exemplary embodiment.

FIG. 2 illustrates a page table, according to an exemplary embodiment.

The page table 200 may include two page table structures per bank for efficiently tracking activations to rows of memory using a reduced number of row activation counters.

The page table structure (RowOneAct) 210 may store entries indicating the rows that have been activated during a tRCRow window. For example, the RowOneAct 210 page table structure may be a 16 entry structure of the bank for tracking activation of rows during a tRCRow window.

The RowOneAct 210 page table structure may associate the row 230 that has been activated during the tRCRow window and a timeout counter (tRCRowCTR) 240 to track the expiration of the tRCRow window for the row 230.

A memory controller may instantiate an entry to the RowOneAct 210 page table structure for the row 230 and initialize the timeout counter 240 to a value equal to tRCRow when an activation of the memory row occurs. The memory controller may also purge an entry from the RowOneAct 210 page table structure once the tRCRow lapses, as determined based on the timeout counter 240. Thereby, the memory controller may query the RowOneAct 210 page table structure to identify rows having been activated during a tRCRow window.

The second entry (RowLeakBuck) 220 may store entries indicating a number of activations for a particular row that has been activated during one or more tRCRow windows.

The RowLeakBuck 220 page table structure may associate the row 250 that has been activated during the tRCRow window, a timeout counter (tRCRowCTR) 260 to track the expiration of the one or more tRCRow windows for the row 250, and an activation counter that counts the number of activations (ActCTR) 270 for a particular row 250 that has been activated during a tRCRow window. When an entry is instantiated into the RowLeakBuck 220 page table structure, the timeout counter 260 may be initialized to a value equal to tRCRow, or alternatively the timeout counter 260 may be initialized to a value equal to the value of the timeout counter 240, if an entry is moved from the RowOneAct 210 page table structure to the RowLeakBuck 220 page table structure, as will be discussed below. Additionally, when an entry is instantiated into the RowLeakBuck 220 page table structure, the activation counter 270 may be initialized to 1.

For example, the RowLeakBuck 220 page table structure may be an 8 entry structure of the bank that employs an 8-bit activation counter 270 for each row entry 250 in the RowLeakBuck 220 page table structure.

The activation counter 270 may be incremented, for example by one, each time a particular row matching an entry 250 in the RowLeakBuck 220 page table structure is activated. As noted above, the timeout counter 260 may be initialized once the particular row matching the entry 250 is activated. Conversely, the activation counter 270 may be decremented, for example by one, every tRCRow window, as the timeout counter 260 lapses.

Upon lapse of the timeout counter 260, if the activation counter 270 still indicates a non-zero quantity of activations, then the timeout counter 260 may be reset to a value equal to tRCRow. The value of the timeout counter 260 may be reset based on the value of the tRCRow window, according to the non-zero quantity of activations, as discussed above.

By accounting for the quantity of activations, as indicated by the activation counter 270, the tRCRow window may be controlled to ensure that the maximum number of activations tMAC will not occur within the DRAM maximum activation window tMAW.

The operations of decrementing the activation counter 270 upon expiration of the timeout counter 260 and resetting the timeout counter 260 may be iteratively repeated until the value of the activation counter 270 reaches zero. When the activation counter 270 reaches zero, the entry for the corresponding row 250 may be removed from the RowLeak-Buck 220 page table structure.

Accordingly, the memory controller may query the RowLeakBuck 220 page table structure to identify the number of activations for highly active rows, and potentially overactive rows, that may necessitate a refresh or throttling of activations to prevent data corruption of adjacent rows.

Figure 3:
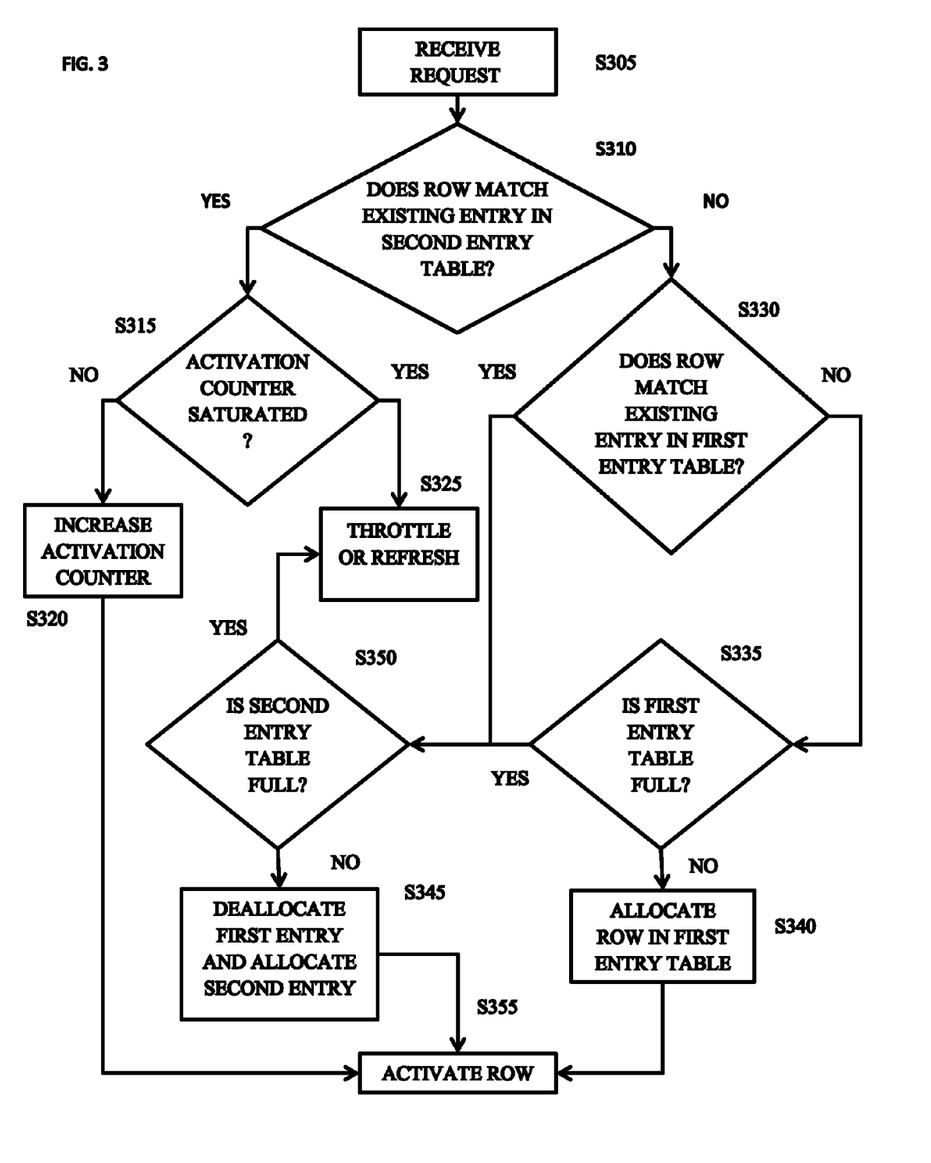
FIG. 3 illustrates a method tracking activations to rows of memory, according to an exemplary embodiment.

FIG. 3 illustrates a method tracking activations to rows of memory, according to an exemplary embodiment.

As discussed above, the memory controller may execute a method of tracking activations to rows of memory to prevent data corruption resulting from frequent access to rows.

In step S305, the memory controller receives a request for memory access to a row.

In step S310, the memory controller queries the second page table structure 220 to determine whether the requested row matches a row 250 of an existing entry in the second page table structure 220.

If it is determined that the requested row matches the row 250 of an existing entry in the second page table structure 220 (step S310-YES), the memory controller determines whether the requested row is an overactive row in step S315 by comparing the activation counter 270 to a threshold. The threshold may be a value of the activation counter 270 indicating that the number of activations for the requested row has reached a maximum value, as discussed above.

If the memory controller determines that the number of activations for the requested row is less than the threshold (step S315-NO), the memory controller increments activation counter 270 for the memory row 250 in the entry of the second page table structure 220 in step S320, and performs the row activation in step S355.

On the other hand, if the memory controller determines that the number of activations for the requested row meets the threshold (step S315-YES), the memory controller may perform a refresh or throttling of the memory activation in step S325. Here, if the memory controller performs a refresh, the activation counter 270 may be reset to zero or the entry for the row 250 may be deallocated from the second page table structure 220. Alternatively, if the memory controller performs a throttling, the memory controller may throttle activation of the row until the activation counter 270 reaches an acceptable lower threshold, as determined based on a continuous lapse of windows indicated by the timeout counter 260.

Reverting to the memory controller's receipt of the request for memory access (step S305), if the memory controller determines that the requested row does not match an existing entry in the second page table structure 220 (step S310-NO), the memory controller determines whether the requested row matches an existing entry in the first page table structure 210 in step S330.

If it is determined that the requested row matches the row 230 of an existing entry in the first page table structure 210 (step S330-YES), thereby indicating that the requested row has already been activated during a current window, the memory controller determines whether an additional entry may be allocated in the second page table structure 220 for tracking the number of activations in step S350.

If the memory controller determines that the second page table structure 220 is full of active entries, and thus an additional entry may not be allocated in the second page table structure 220 (step S350-YES), the memory controller may perform a refresh or throttling of the memory activation in step S325. Here, if the memory controller performs a refresh, the entry for the row 230 may be deallocated from the first page table structure 210. Alternatively, if the memory controller performs a throttling, the memory controller may throttle activation of the row until expiration of the window, as determined based on the timeout counter 240, and the entry for the row 230 may be deallocated from the first page table structure 210.

On the other hand, if the memory controller determines that the second page table structure 220 is not full of active entries (step S350-NO), the memory controller may deallocate the entry for the row 230 from the first page table structure 210 and allocate a corresponding new entry for the requested row in the second page table structure 220 in step S345, and perform the row activation in step S355.

Returning to the memory controller's determination of whether the requested row matches an existing entry in the first page table structure 210 in step S330, if the requested row does not match an existing entry in the first page table structure (step S330-NO), the memory controller determines whether an additional entry may be allocated in the first page table structure 210 for tracking whether a row has been activated during the window in step S335.

If the memory controller determines that the first page table is full of active entries, and thus an additional entry may not be allocated in the first page table structure 210 (step S335-YES), the memory controller determines whether an additional entry may be allocated in the second page table structure 220 for tracking the number of activations in step S350, and performs subsequent determinations discussed above.

Otherwise, if the memory controller determines that the first page table structure 210 is not full of active entries (step S335-NO), the memory controller may allocate a new entry for the requested row in the first page table structure 210, and perform the row activation in step S355.

Figure 4:
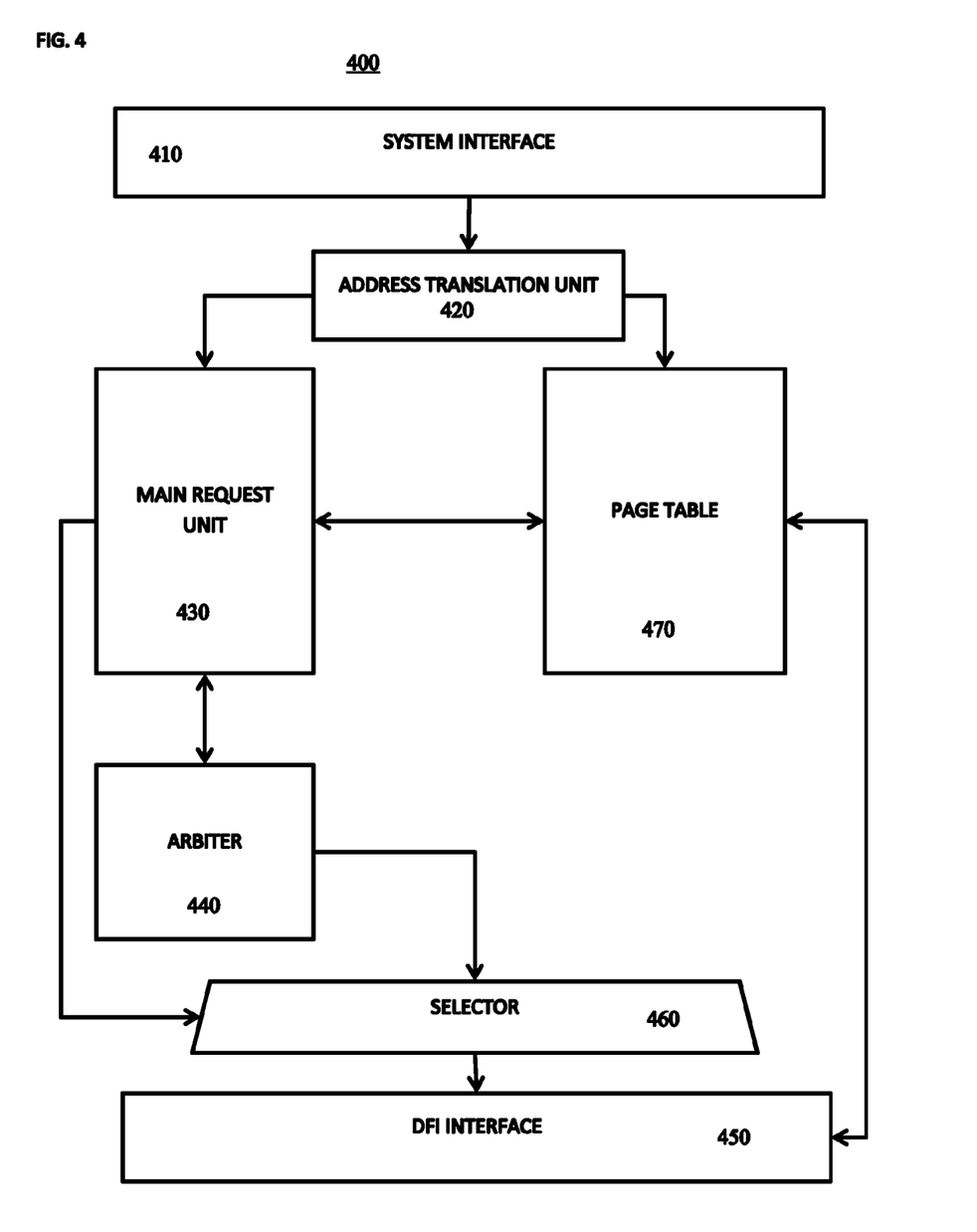
FIG. 4 illustrates a memory controller, according to an exemplary embodiment.

FIG. 4 illustrates a memory controller, according to an exemplary embodiment.

As illustrated in FIG. 4, the memory controller 400 includes a system interface 410, an address translation unit 420, a main request queue 430, an arbiter 440, a DDR Physical Layer Device (DFI) interface 450, a selector 460, and a page table 470.

The page table 470 illustrated in FIG. 4 is similar to the page table 200 illustrated in FIG. 2, and thus a detailed description thereof is omitted.

The system interface 410 is an interface to additional components of the system to which the memory controller 400 belongs, and through which messages and data are transmitted and received.

The address translation unit 420 performs address translation for memory requests received through the system interface 410.

The main request queue 430 stores memory requests received through the system interface 410 and translated by the address translation unit 420.

The arbiter 440 outputs a request signal (Pick Req) to the selector 460 for selecting from among requests stored in the main request queue 430, which are processed through the DFI interface 450.

The page table 470 may be queried in conjunction with the requests stored in the main request queue to determine whether to activate a memory row corresponding to a memory request. A detailed description of the activation determination has been discussed above with respect to FIG. 3, and thus a detailed description thereof is omitted.

The page table 470 may further receive feedback from the DFI interface 450 regarding the activation of the memory row.

Figure 5:
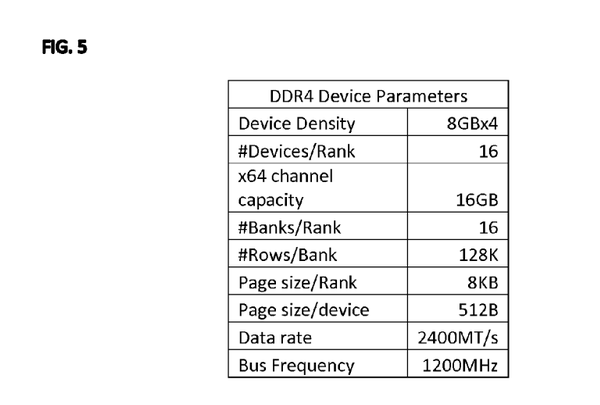
FIG. 5 illustrates device parameters of a double data rate fourth generation (DDR4) DRAM, according to an exemplary embodiment.
Figure 6:
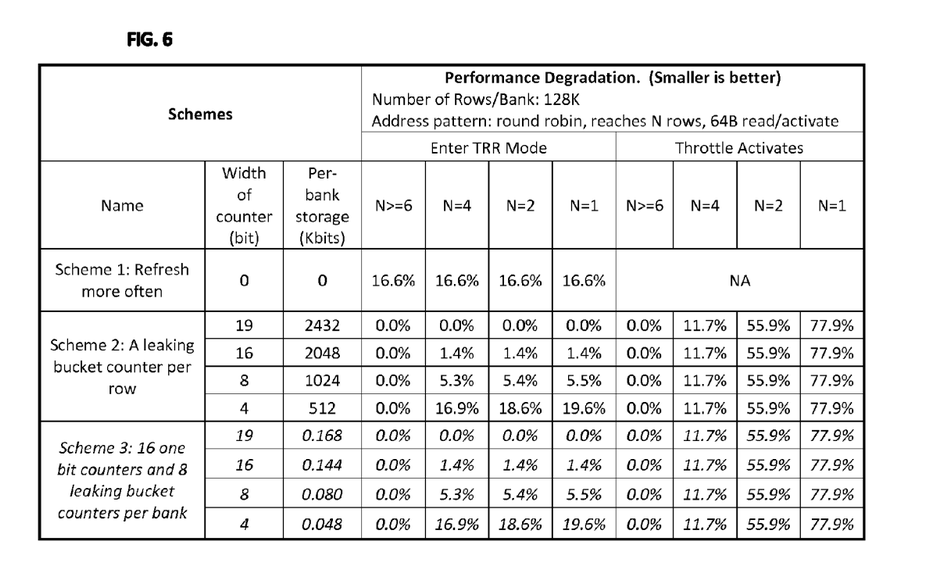
FIG. 6 illustrates performance data testing results employing the method of tracking activations to rows of memory and the device parameters of FIG. 5, according to an exemplary embodiment.

FIG. 5 illustrates device parameters of a double data rate fourth generation (DDR4) DRAM, according to an exemplary embodiment. FIG. 6 illustrates performance data testing results employing method tracking activations to rows of memory and the device parameters of FIG. 5, according to an exemplary embodiment.

As illustrated in FIG. 5, DDR4 DRAM device parameters are shown. The skilled artisan will understand that the DDR4 DRAM device parameters may be determined by a manufacturer.

FIG. 6 illustrates performance data testing results employing the method of tracking activations to rows of memory and the device parameters of FIG. 5, according to an exemplary embodiment.

As illustrated therein, performance data for three schemes (Scheme 1, Scheme 2, and Scheme 3) are shown using seven traffic patterns: one CAS per activation, and round-robin access to N rows, wherein N=128K, 16, 8, 6, 4, 2, 1. The performance metrics illustrate, in a tMAW windows, a comparison of how many activations can be issued to a bank. According to the illustrated exemplary embodiment, there may be more than one bank in a memory channel, and it is assumed that all traffic only goes to one bank.

According to the exemplary embodiment illustrated in FIG. 6, the first and second schemes (Scheme 1 and Scheme 2) are comparative examples to the third scheme (Scheme 3), which implements features of the present disclosure.

In the first scheme (Scheme 1), a bank is refreshed more often than a normal refresh rate to avoid reaching the maximum activations count constraint, so there is no need to enter a refresh (i.e., TRR) mode.

A bank might be activated 300K (MAC) times in 47 ns (tRC)*300K=14.1 ms. If every row is refreshed in this window, it is guaranteed that no more than 300K activations will be applied to any row.

The performance overhead of refreshes is tRFC/tREFI*tMAW/14.1=20.4%. The performance overhead of normal refresh rate is tRFC/tREFI=4.5%. Therefore, the performance overhead of this first scheme is 1−(1−20.4%)/(1−4.5%)=16.6%. According to the exemplary embodiment, the performance overhead is the same for all listed access patterns.

In the second scheme (Scheme 2), a counter is used to track number of recent activations: decreasing the counter every tRCRow and increasing the counter when an activation is sent to the row. A refresh (i.e., TRR mode) is initiated whenever a counter overflows or the activation is throttled whenever its counter reaches the max counter value.

When counter width is 19 bits, total storage overhead per bank is 2432 Kbits (19 bits/row*128K rows=2432 Kbits). If a TRR mode is used when a counter overflow occurs, the number of overflows in tMAW is bounded by (64 ms/47 ns/300 k<5), and so the performance overhead is negligible. To reduce the storage overhead, the number of bits may be reduced per counter. However the number of overflows is larger when using a smaller counter for a same traffic pattern, thus necessitating higher performance overhead. For example, if the counter width is 8, the storage overhead is 1024 Kbits/bank, and performance degradation is increased to 5.4% if N=1 (only access one row).

If a TRR mode is not used, the memory controller throttles activations when a counter reaches the maximum value. For example, if N=1 (only access one row), once the counter of the row reaches the maximum value (300 k), the memory controller can only issue an activation every tRCRow (213.33 ns), so the performance overhead is 1−47 ns/213.ns=77.9%.

In the third scheme (Scheme 3), the complete method illustrated in FIG. 3 is implemented.

The performance overhead is the same as that of the second scheme (Scheme 2). However, the storage overhead is much lower. With this scheme, only 168 (16+(8*19)) counter bits are needed. Because a counter is not stored per row, a row index (17 row address bits) per entry is employed, which adds another 408 bits (24*17).

The total storage for this scheme (168+408) is still significantly less than the other schemes. The performance overhead is the same as the second comparative scheme (scheme 2) because 8 counters (as implemented in the second page table structure 220 of FIG. 2) are sufficient to capture rows with a high quantity of activations when N<=4. When N>4, the bank is not subjected to row hammer issues for the configuration discussed above. Further, the illustrated scheme (Scheme 3) has lower storage and performance overhead than scheme 2, and the illustrated scheme (Scheme 3) has much lower performance and power overhead than the first comparative scheme (Scheme 1).

Notably, for other configurations (tMAW/tMAC), the number of counters (as implemented in the second page table structure 220 of FIG. 2) may be adjusted.

The functions of the exemplary embodiments may be embodied as computer-readable codes in a computer-readable recording medium. The computer-readable recording medium includes all types of recording media in which computer-readable data are stored. Examples of the computer-readable recording medium include a ROM, a RAM, a CD-ROM, a magnetic tape, a floppy disk, and an optical data storage. Further, the recording medium may be implemented in the form of carrier waves such as those used in Internet transmission. In addition, the computer-readable recording medium may be distributed to computer systems over a network, in which computer-readable codes may be stored and executed in a distributed manner.

As will also be understood by the skilled artisan, the exemplary embodiments may be implemented by any combination of software and/or hardware components, such as a Field Programmable Gate Array (FPGA) or Application Specific Integrated Circuit (ASIC), which performs certain tasks. A unit or module may advantageously be configured to reside on the addressable storage medium and configured to execute on one or more processors or microprocessors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or modules or further separated into additional components and units or modules.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A memory controller for controlling a memory, the memory controller comprising:
   a page table configured to store using a first table and a second table, wherein:
   the first table includes a first entry, the first entry comprising:
      a first identifier that identifies a first memory row of the memory activated during a first period of time; and
      a first timeout counter that indicates a first time remaining during the first period of time, and
   the second table includes a second entry, the second entry comprising:
      a second identifier that identifies a second memory row of the memory activated during at least one second period of time;
      an activation counter that counts a quantity of activations of the second memory row; and
      a second timeout counter that indicates a second time remaining during the at least one second period of time.

2. The memory controller according to claim 1, wherein the quantity of activations of the second memory row contribute to a maximum number of permitted activations of the second memory row during a maximum activation window that is a period of time during which the maximum number of permitted activations of the second memory row are permitted without degradation of data stored in an adjacent memory row of the memory located adjacent to the second memory row.

3. The memory controller according to claim 1, wherein the quantity of activations of the second memory row contribute to a maximum number of permitted activations of the second memory row during a maximum activation window that is a period of time during which the maximum number of permitted activations of the second memory row are permitted without refresh of an adjacent memory row of the memory located adjacent to the second memory row.

4. The memory controller according to claim 3, wherein the at least one second period of time is an average amount of time between each of the maximum number of permitted activations of the second memory row within the maximum activation window.

5. The memory controller according to claim 4, wherein the memory controller is configured to receive a request to activate a memory row of the memory, determine that the memory row matches the second memory row identified by the second identifier of the second entry, determine whether the activation counter indicates the maximum number of permitted activations, and execute one of a refresh operation of the memory and a stalling operation of the request in response to determining that the activation counter indicates the maximum number of permitted activations.

6. The memory controller according to claim 5, wherein the memory controller is further configured to increase the activation counter in response to determining that the activation counter does not indicate the maximum number of permitted activations and activate the second memory row.

7. The memory controller according to claim 4, wherein the memory controller is configured to receive a request to activate a memory row of the memory, determine that the memory row matches the first memory row identified by the first identifier of the first entry, deallocate the first entry, allocate a corresponding entry of the memory row in the second table, and activate the memory row.

8. The memory controller according to claim 4, wherein the memory controller is configured to receive a request to activate a memory row of the memory, determine that the memory row does not match the first memory row identified by the first identifier of the first entry, and allocate a corresponding entry of the memory row in the first table.

9. The memory controller according to claim 4, wherein the memory controller is configured to receive a request to activate a memory row of the memory, determine that the memory row matches the first memory row identified by the first identifier of the first entry, determine that the second table cannot allocate an additional entry corresponding to the first memory row, and execute one of a refresh operation of the memory and a stalling operation of the request in response to determining that the second table cannot allocate the additional entry corresponding to the first memory row.

10. The memory controller according to claim 4, wherein the memory controller is further configured determine that the at least one second period of time elapses from the second timeout counter, and decrease the activation counter in response to determining that the at least one second period of time elapses from the second timeout counter.

11. A method of tracking activations to rows of a memory, the method comprising:
   storing a page table in memory, the page table configured to store using a first table and a second table, wherein:
   the first table includes a first entry, the first entry comprising:
      a first identifier that identifies a first memory row of the memory activated during a first period of time; and
      a first timeout counter that indicates a first time remaining during the first period of time, and
   the second table includes a second entry, the second entry comprising:
      a second identifier that identifies a second memory row of the memory activated during at least one second period of time;
      an activation counter that counts a quantity of activations of the second memory row; and
      a second timeout counter that indicates a second time remaining during the at least one second period of time; and
   tracking the activations to the rows of the memory using the page table.

12. The method according to claim 11, wherein the quantity of activations of the second memory row contribute to a maximum number of permitted activations of the second memory row during a maximum activation window that is a period of time during which the maximum number of permitted activations of the second memory row are permitted without degradation of data stored in an adjacent memory row of the memory located adjacent to the second memory row.

13. The method according to claim 11, wherein the quantity of activations of the second memory row contribute to a maximum number of permitted activations of the second memory row during a maximum activation window that is a period of time during which the maximum number of permitted activations of the second memory row are permitted without refresh of an adjacent memory row of the memory located adjacent to the second memory row.

14. The method according to claim 13, wherein the at least one second period of time is an average amount of time between each of the maximum number of permitted activations of the second memory row within the maximum activation window.

15. The method according to claim 14, wherein the tracking comprises:
- receiving a request to activate a memory row of the memory;
- determining that the memory row matches the second memory row identified by the second identifier of the second entry;
- determining whether the activation counter indicates the maximum number of permitted activations; and
- executing one of a refresh operation of the memory and a stalling operation of the request in response to determining that the activation counter indicates the maximum number of permitted activations.

16. The method according to claim 15, wherein the tracking further comprises:
- Increasing the activation counter in response to determining that the activation counter does not indicate the maximum number of permitted activations and activate the second memory row.

17. The method according to claim 14, wherein the tracking comprises:
- receiving a request to activate a memory row of the memory;
- determining that the memory row matches the first memory row identified by the first identifier of the first entry;
- deallocating the first entry;
- allocating a corresponding entry of the memory row in the second table; and
- activating the memory row.

18. The method according to claim 14, wherein the tracking comprises:
- receiving a request to activate a memory row of the memory;
- determining that the memory row does not match the first memory row identified by the first identifier of the first entry; and
- allocating a corresponding entry of the memory row in the first table.

19. The method according to claim 14, wherein the tracking comprises:
- receiving a request to activate a memory row of the memory;
- determining that the memory row matches the first memory row identified by the first identifier of the first entry;
- determining that the second table cannot allocate an additional entry corresponding to the first memory row; and
- executing one of a refresh operation of the memory and a stalling operation of the request in response to determining that the second table cannot allocate the additional entry corresponding to the first memory row.

20. The method according to claim 14, wherein the tracking comprises:
- determining that the at least one second period of time elapses from the second timeout counter; and
- decreasing the activation counter in response to determining that the at least one second period of time elapses from the second timeout counter.

* * * * *